United States Patent
You et al.

(10) Patent No.: US 7,368,303 B2
(45) Date of Patent: May 6, 2008

(54) METHOD FOR TEMPERATURE CONTROL IN A RAPID THERMAL PROCESSING SYSTEM

(75) Inventors: Wei-Ming You, Taipei (TW); Shi-Ming Wang, Tainan (TW); Cheng Wei Chen, Shan (TW); Jian-Hua Huang, Jhonghe (TW); Yu-Lin Du, Chihshang Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 609 days.

(21) Appl. No.: 10/969,475

(22) Filed: Oct. 20, 2004

(65) Prior Publication Data

US 2006/0084188 A1     Apr. 20, 2006

(51) Int. Cl.
*G01R 31/26* (2006.01)
*H01L 21/66* (2006.01)

(52) U.S. Cl. .................. 438/14; 438/663; 438/584; 257/E21.324; 257/E21.497

(58) Field of Classification Search .................. 438/14
See application file for complete search history.

(56) References Cited

U.S. PATENT DOCUMENTS

| | | | |
|---|---|---|---|
| 5,001,327 A * | 3/1991 | Hirasawa et al. ............ 219/390 |
| 5,268,989 A * | 12/1993 | Moslehi et al. ............. 392/418 |
| 5,444,815 A | 8/1995 | Lee et al. |
| 5,517,594 A | 5/1996 | Shah et al. |
| 5,616,264 A * | 4/1997 | Nishi et al. .................. 219/494 |
| 5,970,313 A | 10/1999 | Rowland et al. |
| 5,994,676 A | 11/1999 | Ditartre |
| 6,015,717 A | 1/2000 | Tripsas |
| 6,033,922 A | 3/2000 | Rowland et al. |
| 6,342,691 B1 | 1/2002 | Johnsgard et al. |
| 6,472,232 B1 | 10/2002 | Johnson |

(Continued)

FOREIGN PATENT DOCUMENTS

WO    WO 03/107414    12/2003

OTHER PUBLICATIONS

Camm et al., High Power ARC Lamp RTP System for High Temperature Annealing Applications, IEEE, 1994, pp. 1-7.

(Continued)

*Primary Examiner*—Walter Lindsay, Jr.
*Assistant Examiner*—Abdulfattah Mustaph
(74) *Attorney, Agent, or Firm*—Baker & McKenzie LLP

(57) ABSTRACT

A method is disclosed for a multi-zone interference correction processing for a rapid thermal processing (RTP) system. This processing allows for improved calibration/tuning of RTP systems by accounting for zone coupling. The disclosed method includes establishing baseline characteristic data and zone characteristic data, and then using the baseline and zone characteristic data to determine lamp-control parameters, such as temperature offset values, for temperature sensors of the RTP system. The baseline characteristic data includes information regarding baseline heating uniformity of an RTP system. The zone characteristic data is collected for a plurality of heating zones within the heating chamber of the RTP system, each zone being associated with a respective temperature probe. The zone characteristic data is collected based on controlled temperature sensor variations. The lamp-control parameters for temperature probes of the RTP system are then calculated based on the baseline characteristic data and the zone characteristic data.

20 Claims, 16 Drawing Sheets

U.S. PATENT DOCUMENTS

| | | |
|---|---|---|
| 6,638,629 B2 | 10/2003 | Johnson et al. |
| 6,740,196 B2 | 5/2004 | Lee et al. |
| 6,754,553 B2 | 6/2004 | Wieczorek |
| 2003/0201068 A1 | 10/2003 | Mercaldi et al. |
| 2003/0235928 A1 | 12/2003 | Lu et al. |
| 2006/0019415 A1* | 1/2006 | Jaiswal et al. ............... 438/14 |

OTHER PUBLICATIONS

Bates, Silicon Wafter Processing, SJSU/Applied Materials/IISME-ETP, 2000, pp. 1-14.

Motamarri, Temperature Measurements and Control in Rapid Thermal Processing, University of Houston, Dept. of Electrical and Computer Engineering, pp. 1-14.

Fraser, et al., Temperature Measurement for Rapid Thermal Processing, National Institute of Standards and Technology, Sep. 1997, pp. 1-5.

Yarling, Selection Criteria for the Discriminating RTP User, Semiconductor Technology Institute, 2001, pp. 1-12.

* cited by examiner

METHOD FOR TEMPERATURE CONTROL IN A RAPID THERMAL PROCESSING SYSTEM

TECHNICAL FIELD

This invention relates, in general, to processes involved in the manufacture of semiconductor devices. More particularly, the present invention relates to methods and apparatus for performing rapid thermal processing (RTP).

BACKGROUND

The processing of silicon wafers to produce integrated circuits generally includes one or more stages of wafer heating. One approach for wafer heating is Rapid Thermal Processing (RTP), which is presently used for a variety of applications including silicidation, oxide formation, and anneal processes. A typical RTP system includes a heating chamber in which a wafer is positioned for thermal processing. High-intensity heating lamps are controlled for generating radiant heat for heating the wafer, and temperature sensing equipment is provided for sensing the temperature in the chamber and/or for feedback-control of the heating lamps. The wafer is rapidly heated and cooled (e.g., 50° to 250° C./sec), usually maintaining a peak temperature (e.g., 150° to 1200° C.) for a short period of time (e.g., 10 to 120 sec) according to a prescribed RTP recipe.

An important factor in the thermal processing of wafers is maintaining temperature uniformity within the wafer. A temperature difference across a wafer can cause Vt variations within the wafer and/or stress that leads to device damage, resulting in decreased product yield. For this reason, temperature uniformity during RTP is a subject of considerable interest, and Temperature uniformity during RTP is often inferred from the sheet-resistance uniformity of the wafer post-processing. Sheet resistance varies according to the temperature to which the wafer is heated, so variations in sheet resistance can serve as an accurate indicator of variations in temperature that occurred during RTP.

One of the ways of monitoring the annealing temperature within the heating chamber is to calibrate the heating chamber with a thermal coupled standard consisting of temperature sensors that display the exact temperature depending on the location of these sensors while the thermal coupled standard is seated inside the heating chamber. However, thermal coupled standard monitor and calibration cannot be performed while wafers are being processed inline, and often requires the RTP system be taken offline in order to perform the calibrations which can be costly as well as time consuming.

A more time and cost efficient method of monitoring the annealing temperature uniformity within the heating chamber is to use the Rs-49 point contour map. The Rs-49 point contour map method assesses wafer heating uniformity by measuring the sheet resistance (Rs) of 49 uniformly distributed points across the semiconductor substrate after the semiconductor substrate has been annealed inside the heating chamber. The measurements can be done on batches of processed wafers and provide a quick and accurate assessment of the annealing temperature uniformity by plotting a contour map of the Rs values based on their position on the semiconductor substrate. The measurements can then be used to calibrate or fine-tune the RTP system for improving heating uniformity. However, while the Rs-49 point contour map method is an efficient method to monitor and fine tune RTP systems, there remains considerable room for improvement. Thus, there exists a need for improved techniques for calibrating or fine-tuning RTP systems in order to provide for more ideal heating uniformity during RTP processes.

SUMMARY

For RTP systems that utilize a multi-zone tungsten-halogen lamp module, it has been recognized that strong temperature coupling effects exist among the internal temperature probes located within the RTP system itself. Conventional methods of calibrating RTP systems, including those based on the Rs-49 point contour map, do not account for this coupling effect, resulting in less-than-ideal system tuning. Accordingly, an improved calibration/tuning method and system is disclosed herein that accounts for zone coupling. This method is also referred to as a multi-zone interference correction process. Generally, the multi-zone interference correction process includes steps of establishing baseline characteristic data and zone characteristic data, and then using the baseline and zone characteristic data to determine lamp-control parameters for temperature probes of the RTP system. The baseline characteristic data includes information regarding baseline heating uniformity of an RTP system. The zone characteristic data is collected for a plurality of heating zones within the heating chamber of the RTP system, each zone being associated with a respective temperature probe. The zone characteristic data is collected based on controlled temperature sensor variations. The lamp-control parameters for temperature probes of the RTP system are then calculated based on the baseline characteristic data and the zone characteristic data.

BRIEF DESCRIPTION OF THE DRAWINGS

Embodiments are illustrated by way of example in the accompanying figures, in which like reference numbers indicate similar parts, and in which.

DETAILED DESCRIPTION

Figure 1:
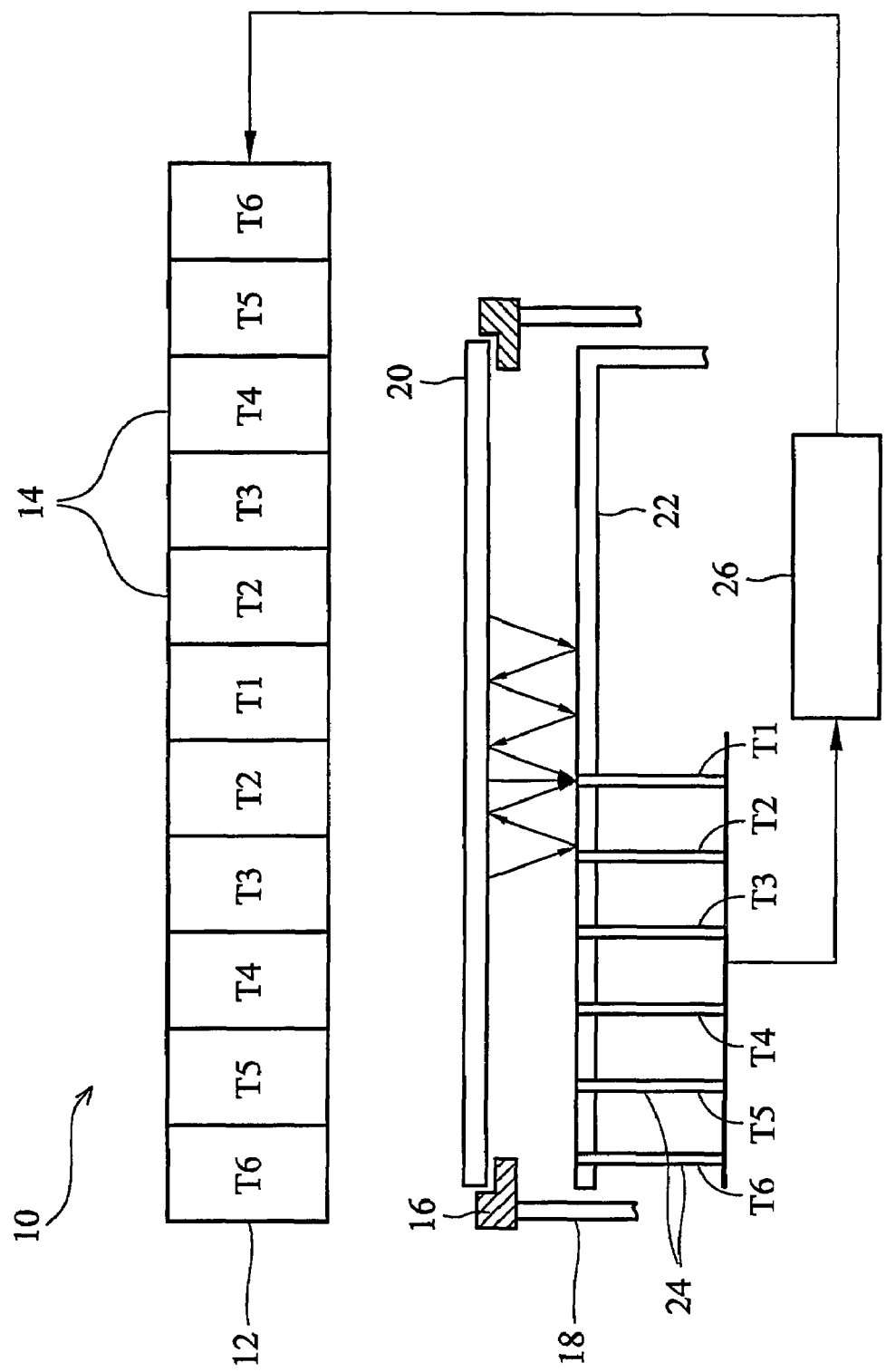
FIG. 1 shows a schematic block diagram of a Rapid Thermal Processing (RTP) system.

FIG. 1 shows a schematic block diagram of a Rapid Thermal Processing (RTP) system 10. The RTP system 10 includes lamp module 12, provided with an array of multiple halogen, silicon carbide, or arc lamps 14. A wafer edge ring 16 is supported by a support cylinder 18 and is adapted for supporting the edges of a semiconductor wafer 20. An upward-facing, circular reflector plate 22, circumscribed by the support cylinder 18, is provided for reflecting infrared heat radiation from the lamps 14. It will be apparent to those skilled in the art that the concepts disclosed herein are equally applicable to other semiconductor fabrication equipment and single-wafer processing configurations.

A plurality of temperature probes 24 (e.g., fiber optic probes connected to pyrometers) extend through the reflector plate 22 for temperature monitoring of respective zones. The RTP system 10 includes six temperature probes 24 used for temperature control. The temperature-control probes 24 are designated individually from the wafer center towards the wafer edge as probes T1-T6. It will be appreciated by those skilled in the art that the RTP system can also include additional temperature probes (not shown) used for purposes other than feedback temperature control. The temperature probes 24 provide temperature data to a control system 26 for feedback control of the lamps 14, particularly those having like designations T1-T6. During a rapid thermal process, such as annealing or oxidation, the semiconductor wafer 20 is rapidly heated to a prescribed temperature by operation of the lamps 14, according to a preset processing recipe programmed into the control system 26. Infrared or heat radiation beams from the lamps 14 penetrate the semiconductor wafer 20 and strike the reflector plate 22, with the frequency or energy level of the beams striking the reflector plate 22 depending upon the emissivity of the wafer 20. The emissivity, or measure of the relative quantities of energy absorbed and reflected by the wafer 20, is highly material- and position-dependent, as various areas of the wafer 20 may include various oxides, polysilicon or other components. After initially striking the reflector plate 22, the energy beams are reflected back toward the backside of the wafer 20, and strike the backside of the wafer 20 and are reflected back toward the reflector plate 22. Eventually, the energy beams strike and are absorbed by one of the temperature probes 24, which can measure the temperature of the heat radiating from the wafer 20 and provide continuous data input to the control system 26 for precise temperature control of the wafer 20.

In order to prevent damage to the wafer 20, the wafer 20 should be heated very uniformly across its entire surface. Using data received from the temperature probes 24, the control system 26 can perform feedback control of the lamps 14 in order to uniformly to heat the wafer 20. However, the temperature probes 24 do not give an exact image of the temperature of the wafer 20. Rather, they are brought to temperatures that are different from those of the wafer 20. These temperatures therefore may be used only as information for correcting and regulating the temperature of the wafer 20. The control system 26 processes the data received from the temperature probes 24 for control of the lamps 14 according to preset operating parameters programmed into the control system during manufacturing or periodic system calibration. Periodic calibration of the RTP system 10 allows for adjustments in the processing of the control system 26 to account for such things as variations in the temperature probes 24 or lamps 14.

Figure 2:
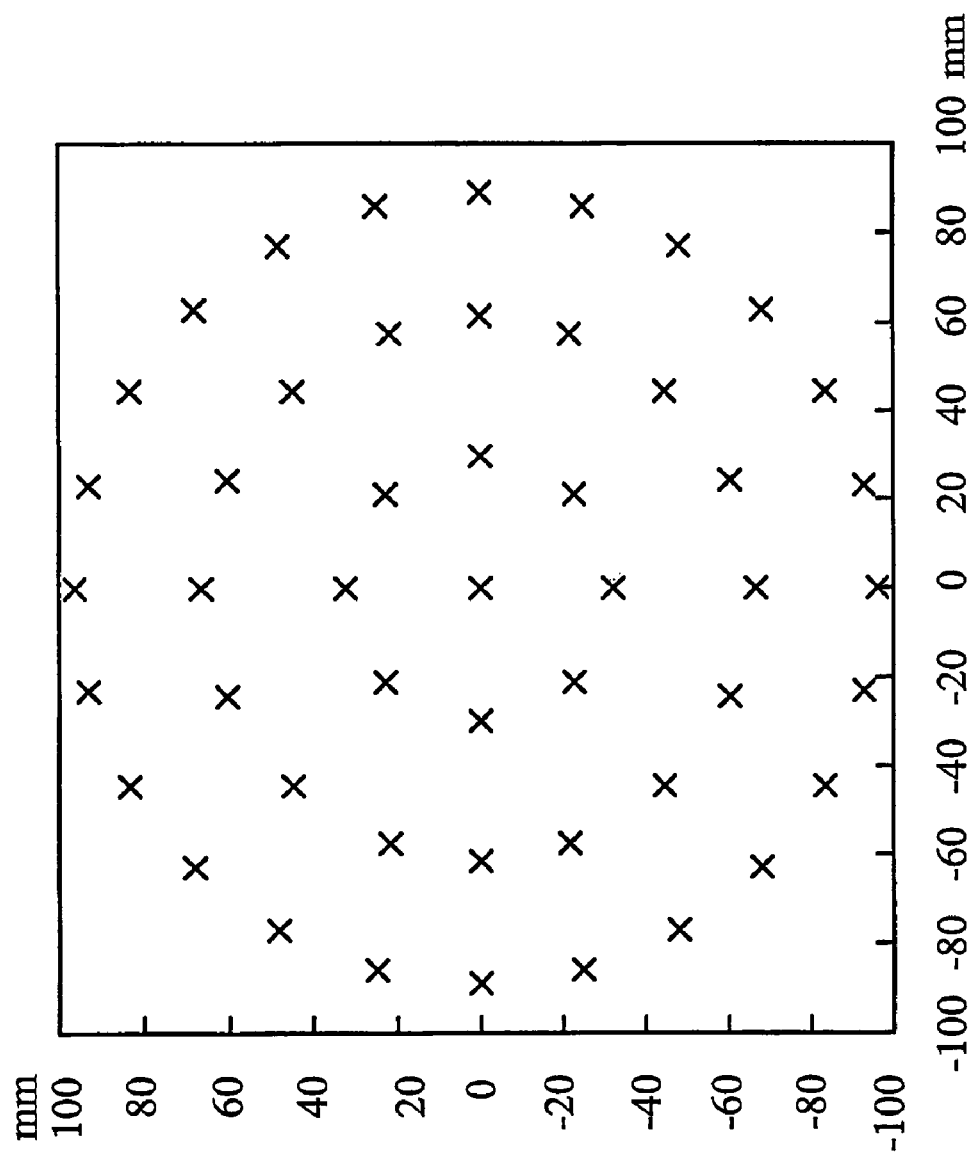
FIG. 2 shows a plot diagram illustrating measurement points used for an Rs-49 calibration method.
Figure 3:
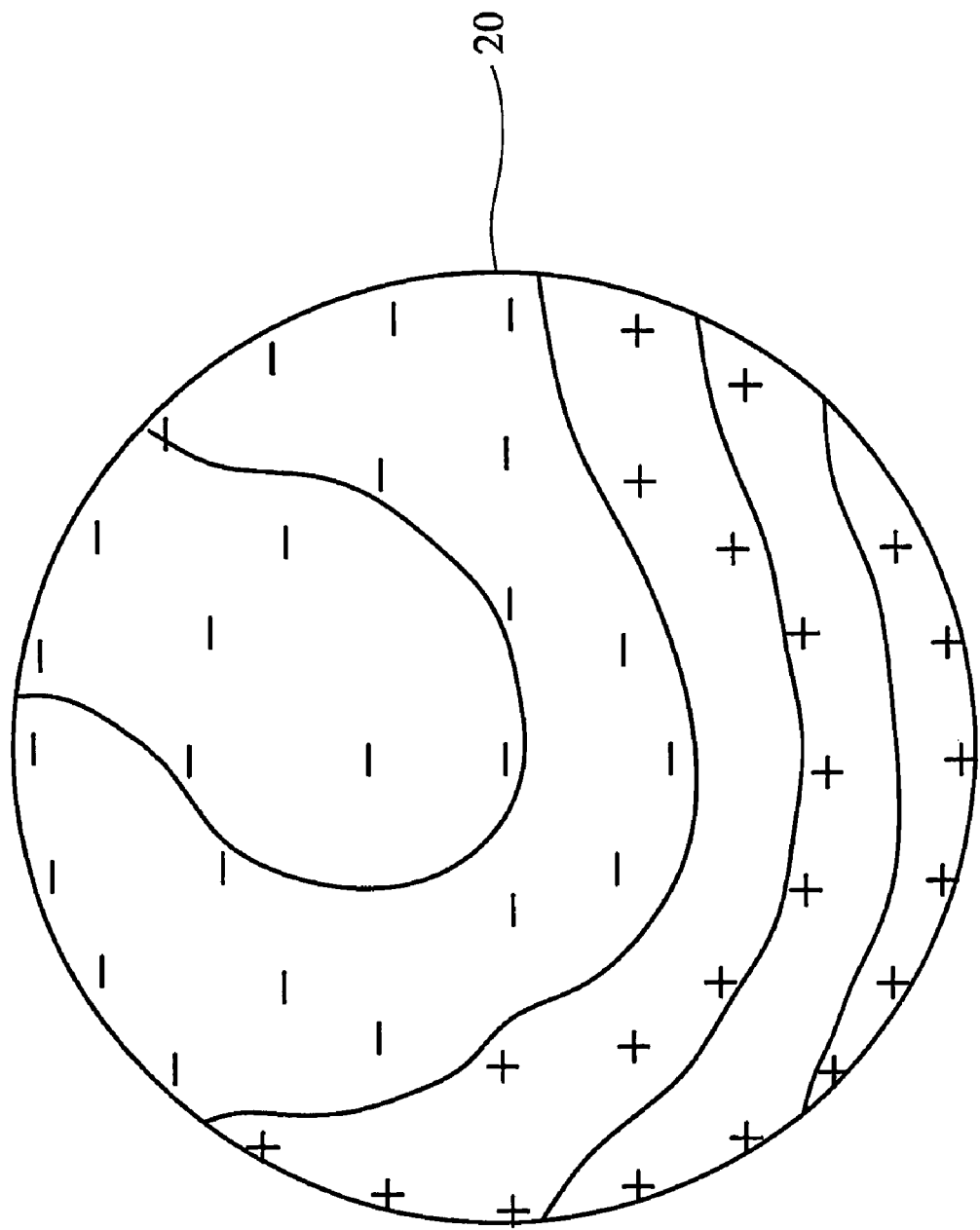
FIG. 3 shows an example of a 49-point contour map created during an Rs-49 calibration method.

Since the temperature variations across the wafer 20 are not directly measured during thermal processing, characteristics of the wafer 20 that vary with temperature can instead be measured and used to deduce the temperature variation measurements. One such characteristic is sheet resistance. There are known relationships between the sheet resistance of a semiconductor wafer and the maximum temperature to which it has been subjected. Thus, one method of calibrating the RTP system 10 involves measuring the sheet resistance of the wafer 20 at numerous points (e.g., 49 points on a 200 mm wafer) dispersed somewhat equally across a surface of the wafer 20 after thermal processing is complete (Rs-49 calibration method). The sheet resistance of the wafer 20 is measured at 49 points according to a plot diagram, for example as shown in FIG. 2, using a commercially-available tool, for example a four-point sheet-resistance measure tool such as the KLA Tencor Rs-75 resistivity measurement system. The measured sheet resistance at each of the designated points is used to create a 49-point contour map, for example as shown in FIG. 3, for graphically illustrating the measurement results. In FIG. 3, the "−" sign indicates a point where the sheet resistance is below a calculated mean sheet resistance value, the "+" sign indicates a point where the sheet resistance is above the calculated mean sheet resistance value, and the contour lines provide general indications of lines of common sheet resistance values. This way, the 49-point contour map provides a visual indication of the sheet-resistance variations, thereby conveying information related to how well the control system 26 is controlling the lamps 14 to maintain temperature uniformity across the wafer 20. This information can then be used according to known methods to generate lamp-control parameter data for calibration of the control system 26. The lamp-control parameter data preferably includes an offset value for each of the temperature probes 24.

However, even when adjustments are made according to a calibration method such as the Rs-49 calibration method described above, wafer temperature uniformity falls short of desirable levels. One reason for this is that Rs-49 calibration method does not adequately account for zone coupling. For example, referring back to FIG. 1, heat energy (represented by arrows between wafer 20 and reflector plate 22) travels between the wafer 20 and the reflector plate 22 until it is eventually detected by the temperature probe T2. However, some of that heat energy continues to be reflected between the reflector plate 22 and the wafer 20, and is detected again by the neighboring temperature probe T1. Thus, the total heat energy detected by temperature probe T1 includes heat energy traveling from neighboring zones, resulting in a form of interference referred to herein as zone coupling.

Figure 4:
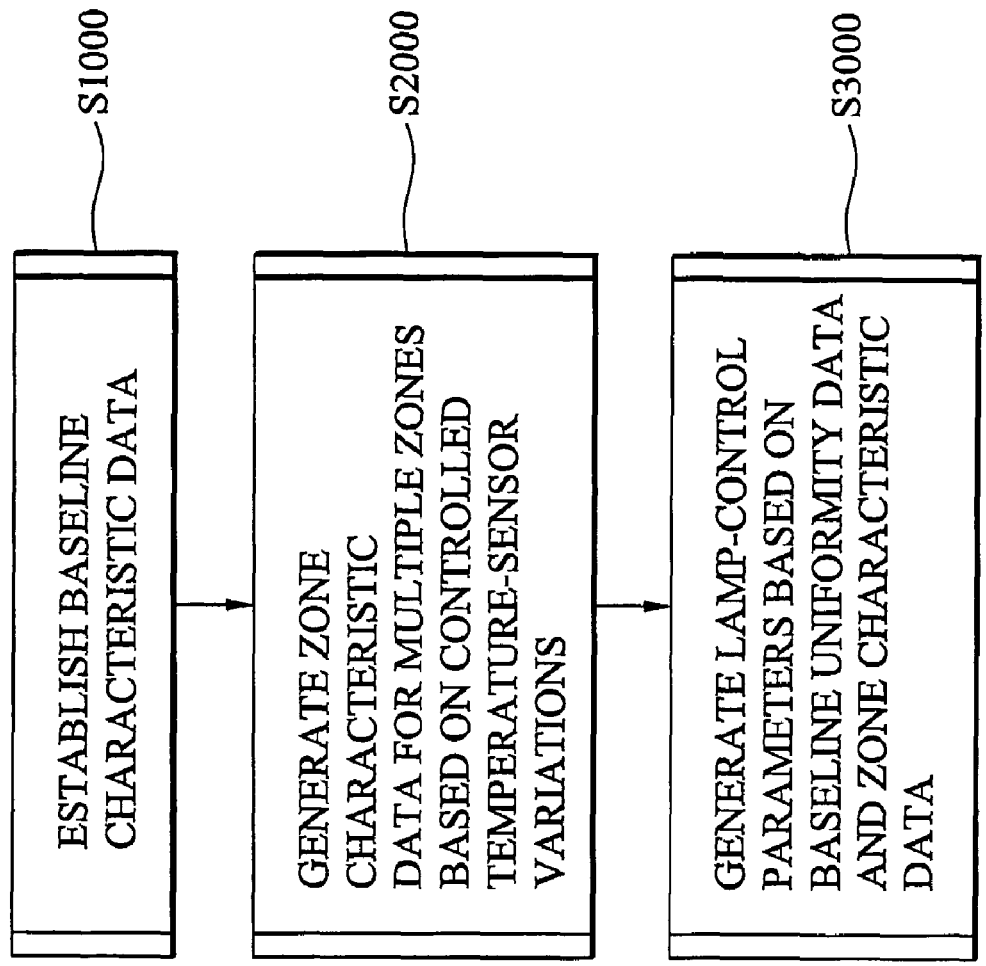
FIG. 4 shows a flowchart of steps in a multi-zone interference correction process.

In order to account for zone coupling, a multi-zone interference correction process is disclosed herein that includes steps in the flowchart shown in FIG. 4. Generally, the multi-zone interference correction process includes step S1000, where baseline characteristic data is established. The baseline characteristic data includes information regarding baseline heating uniformity of the RTP system 10. Step S1000 is discussed in greater detail below in connection with FIGS. 5-8. At step S2000, zone characteristic data for a plurality of heating zones within the heating chamber of the RTP system is collected based on controlled temperature sensor variations. Step S2000 is discussed in greater detail below in connection with FIGS. 6, 8, and 9. Finally, at step S3000, lamp-control parameters for temperature probes of the RTP system are determined based on the baseline characteristic data and the zone characteristic data. Step S3000 is discussed in greater detail below in connection with FIG. 10.

Figure 5:
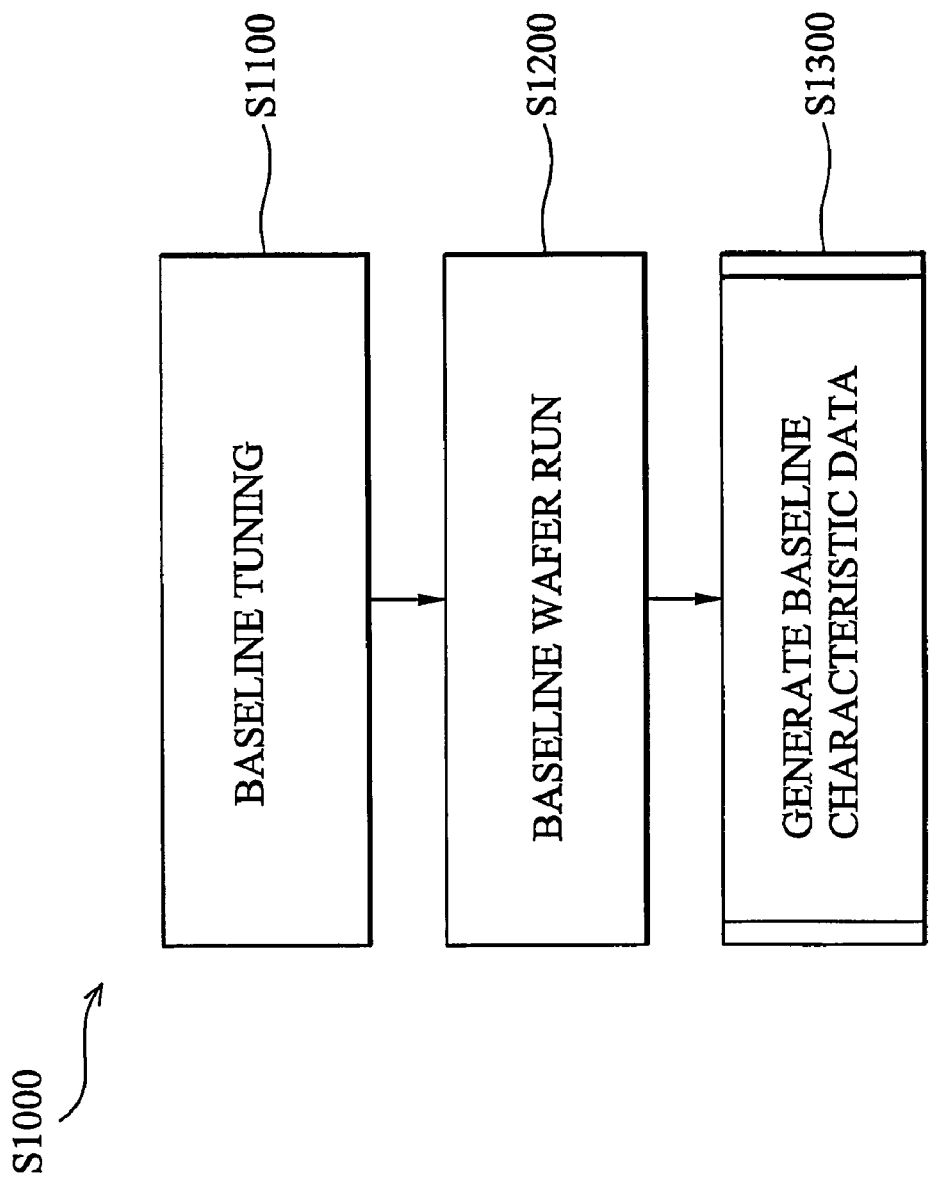
FIG. 5 shows a flowchart of steps in a process of establishing baseline characteristic data.

FIG. 5 shows a flowchart of a process for establishing baseline characteristic data (step S1000). This process includes an optional step S1100 of establishing a baseline set of offset values for the temperature probes of the RTP system. The baseline offset values preferably include a numerical value for each of the temperature probes 24 (T1-T6) that can be used to offset temperature measurements made by the temperature probes 24 in order to adjust for errors in the temperature measurements. The baseline offset values can be selected to be system default values, null values, or values obtained during a prior system calibration. The baseline offset values can also be obtained by performing a system calibration of some kind, including known RTP system calibration methods. For example, step S1100 can include performing the Rs-49 calibration method described above.

Next, at step S1200, the baseline offset values are programmed into the control system 26 and a wafer 20 is processed in the RTP system 10 according to a prescribed recipe. The processed wafer 20 is then used in step S1300 to generate baseline wafer characteristic data. The baseline characteristic data provides information indicating how uniformly a wafer is heated by the RTP system 10 using the baseline offset values.

Figure 6:
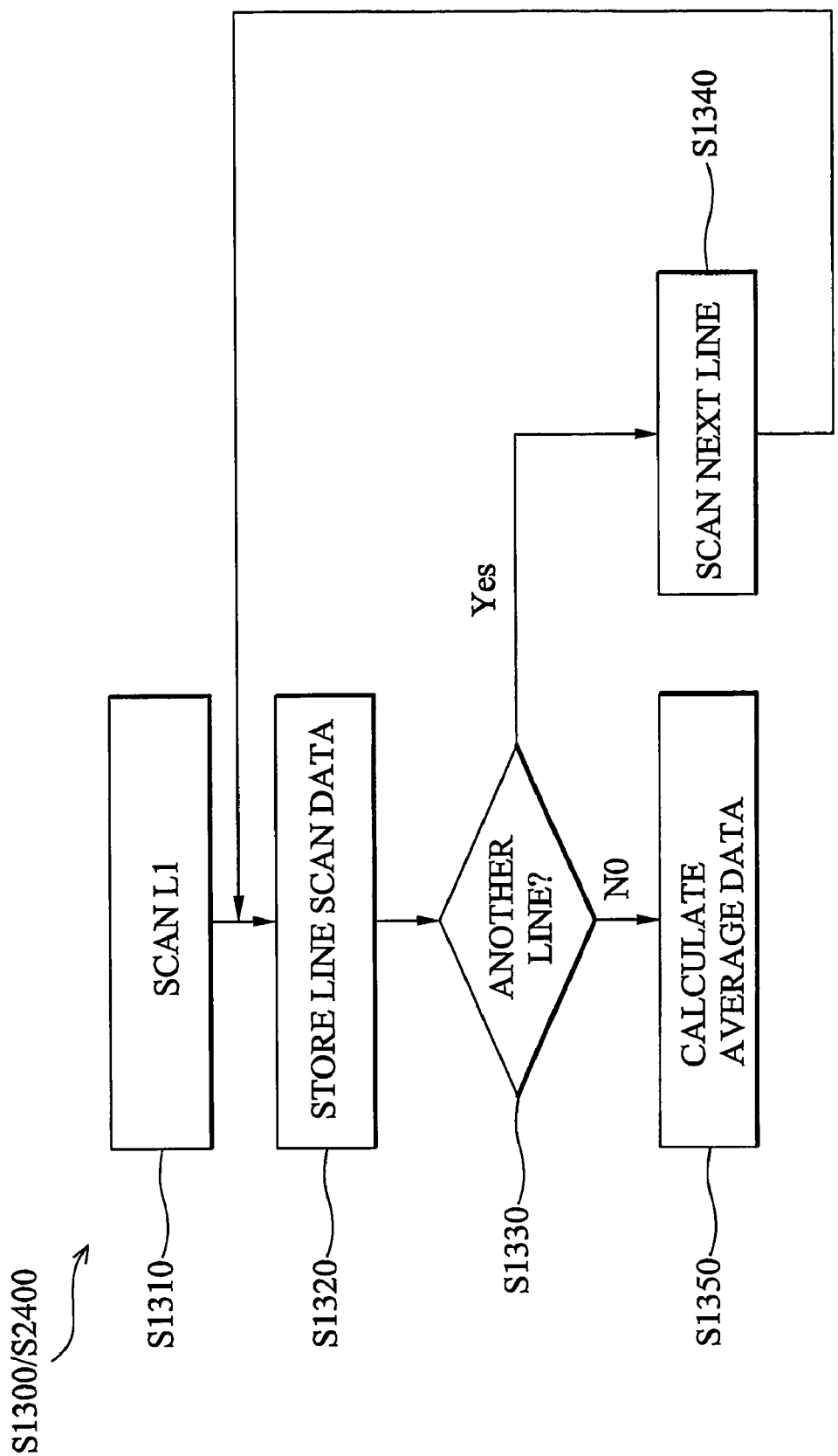
FIG. 6 shows a flowchart of steps in a process of generating baseline characteristic data.

FIG. 6 shows a flowchart illustrating a process included in step S1300. This process includes taking a series of sheet-resistance measurements along a line ("line scan") that extends across a diameter of the wafer. At step S1310, a first line scan is made along a line L1 shown in FIG. 7. The line scan includes measuring sheet resistance at points $P_l$ through $P_n$ along line L1, where n is an odd integer. Note that points $P_l$ thru $P_{(n-l)/2}$ are distributed along one side of the wafer 20, point $P_{(n+l)/2}$ is at the center of the wafer 20, and points $P_{(n+3)/2}$ thru $P_n$ are distributed along the other side of the wafer 20. The points of measurement preferably are somewhat evenly distributed along line L1. For example, in a case where the wafer 20 has a diameter of 200 mm, resistivity measurements can be made at 121 points (i.e., n=121) positioned approximately every 1.6 mm. In alternate embodiments, measurements can be taken along line L1 at points $P_l$-$P_n$, where n is an even integer, and where points $P_l$ thru $P_{n/2}$ are to the right of the center of the wafer 20, and points $P_{(n+2)/2}$ thru $P_n$ are on to the left of the center of the wafer 20.

Figure 8:
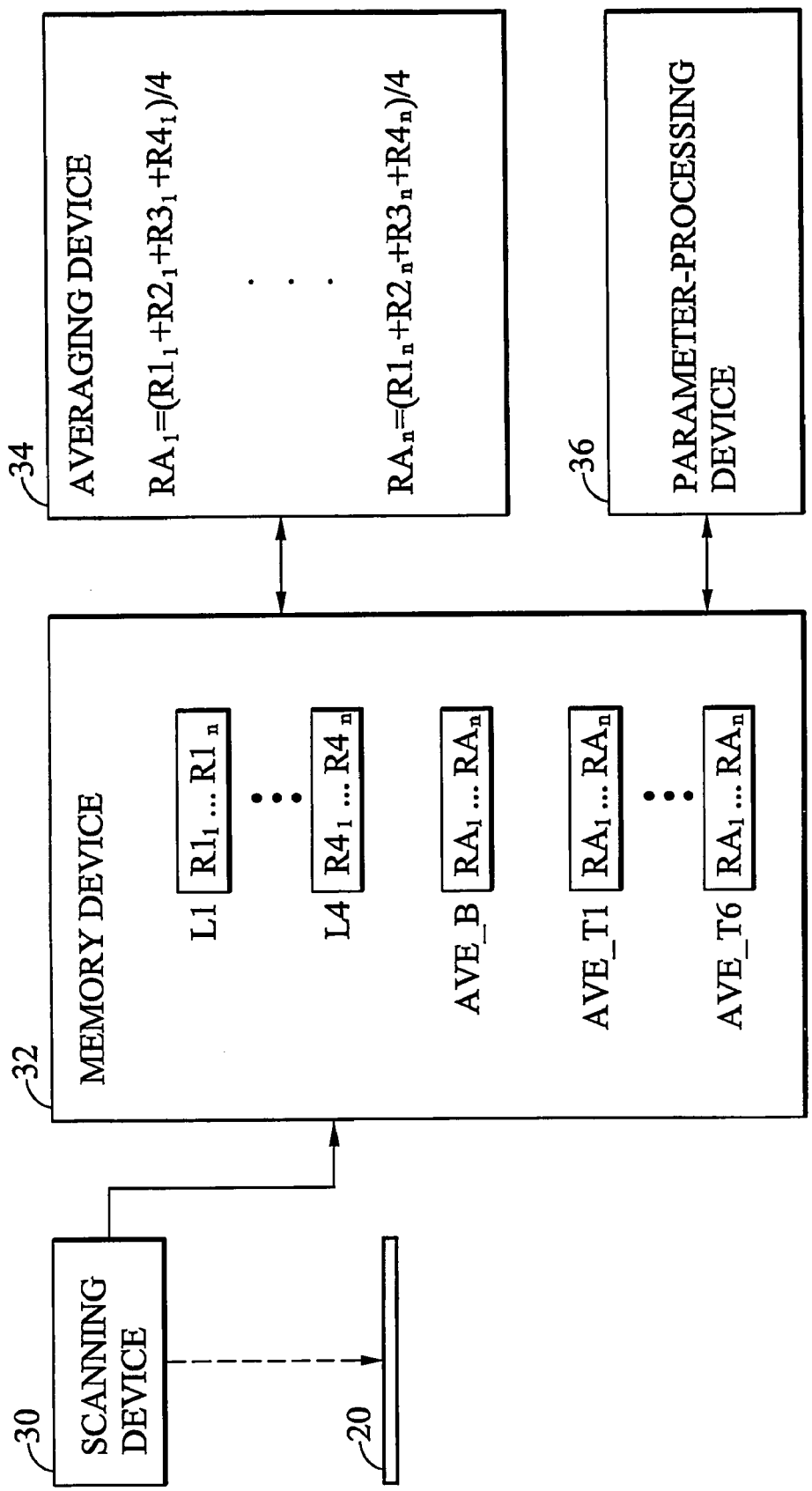
FIG. 8 shows a system for performing steps of the process shown in FIG. 4.

Referring now to FIG. 8, a scanning device 30 (e.g., KLA Tencor Rs-75) is used for making the sheet-resistance measurements in step S1310. In step S1320 of FIG. 6, the scanning device 30 provides the resistivity values as line scan data to a memory device 32. The memory device 32 stores an array of resistance values $R1_l$-$R1_n$ of points $P_l$-$P_n$, respectively, along line L1.

Figure 7:
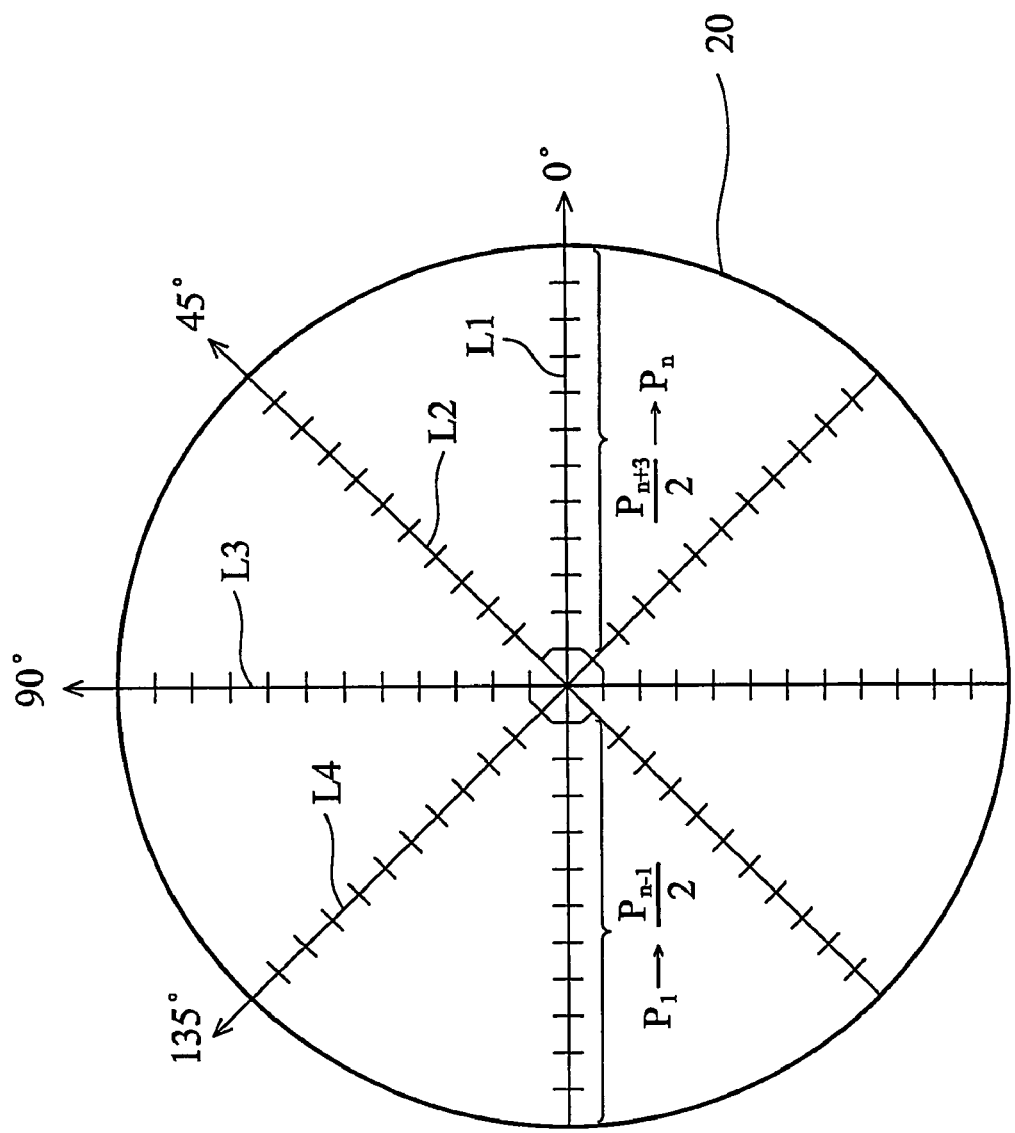
FIG. 7 shows a plan view of a wafer, illustrating measurement points used for the process of FIG. 6.

In a preferred embodiment, additional scans are performed along lines L2-L4 shown in FIG. 7, where lines L2-L4 are angularly displaced from line L1 by angles of 45°, 90°, and 135°, respectively. Accordingly, at step S1330 a determination is made as to whether another line remains to be scanned. After scanning of line L1, the process continues to step S1340 ("Y" at step S1330) in order to perform a line scan along line L2, then back to step S1320 where line scan data is stored in the memory device 32 in an array of resistance values $R2_l$-$R2_n$ associated with L2. The process will continue the loop of steps S1340, S1320, and S1330 until each of lines L1-L4 has been scanned and resistance values for each of the line scans has been stored. Preferably, lines L2-L4 are identical to line L1 with respect to the number and distribution of the measurement points P along each of the lines L2-L4 (e.g., number n of points P along each of lines L1-L4=121; points occurring approximately every 1.6 mm).

Once line scan data has been generated and stored for each of the lines L1-L4, the process continues to step S1350 ("N" at step S1330). At step S1350, an array AVE_B of average baseline resistance values $RA_l$-$RA_n$ is calculated by an averaging device 34. Thus, the array AVE_B is an average of the arrays L1-L4:

$$\begin{bmatrix} RA_l = (R1_l + R2_l + R3_l + R4_l)/4 \\ \vdots \\ RA_n = (R1_n + R2_n + R3_n + R4_n)/4 \end{bmatrix}$$

The array AVE_B having thus been generated constitutes the baseline characteristic data for step S1300 of FIG. 5. Note that the arrays AVE_T1, AVE_T2, and AVE_T3 shown in FIG. 8 will be discussed below.

Figure 9:
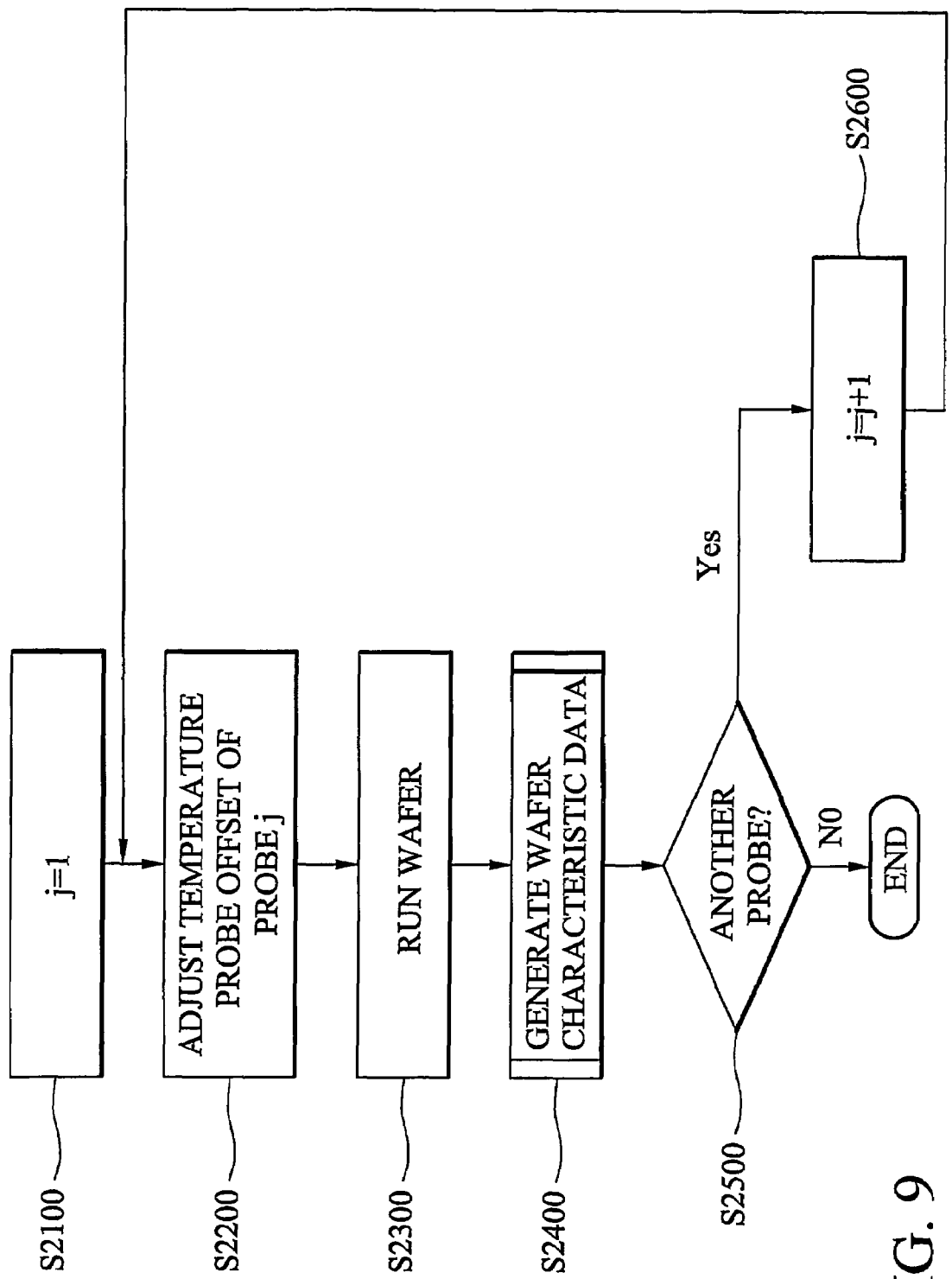
FIG. 9 shows a flowchart of steps in a process of generating zone characteristic data.

The multi-zone interference correction process shown in FIG. 4 continues to step S2000, which is preferably performed according to the flowchart shown in FIG. 9. In general, the process shown in FIG. 9 includes running a series of wafers 20 in the RTP system 10, where one of the temperature probes 24 is offset (e.g., +3° C.) during each run, then comparing the effects of each run in order to refine the baseline offset values (established in step S1100 of FIG. 5) for reduction of the zone-coupling effect.

Referring again to FIG. 1, during a first cycle (i.e., steps S2200-S2600) of the process of FIG. 9 the control system 26 offsets temperature measurements received from temperature probe T1 by a predetermined amount, for example 3° C., causing the lamps associated with T1 to heat to a temperature that is different than the lamps associated with T2-T6. For example, for an RTP processing recipe that requires heating to 925° C., the lamps T1 will be actually heating to 928° C. while the remaining lamps heat to 925° C. Thus, the wafer 20 is intentionally heated unevenly due to the temperature offset introduced to data from temperature probe T1. This cycle is then repeated for each of the remaining temperature probes T2-T6. Characteristics of the unevenly-heated wafers 20 resulting from each of these cycles can then be measured and used to refine the baseline offset values (established in step S1100 of FIG. 5) for reduction of the zone-coupling effect as described further below.

Referring back to FIG. 9, steps for accomplishing this process will now be described in greater detail. At step S2100, a counter "j" is initialized to "j=1". The counter j is used for tracking which of the temperature probes T1-T6 is the temperature probe being offset during the current cycle.

At step S2200, for j=1 the control system 26 offsets for temperature probe T1 according to a prescribed temperature offset, for example +3° C. Then, at step S2300 a wafer 20 is processed according to a prescribed RTP processing recipe. As mentioned above, since the control of the lamps associated with probe T1 are influenced by the temperature offset, the wafer 20 experiences uneven heating, particularly in the vicinity of the lamps T1.

Next, at step S2400 the wafer 20 that has undergone the uneven heating in step S2300 is used to generate wafer characteristic data. This step is preferably performed according to the process shown in FIG. 6 and discussed above, so description thereof is not repeated here for the sake of brevity. An array of average resistance values associated with the probe T1 being offset is designated AVE_T1 in FIG. 8.

At step S2500, a determination is made as to whether another probe remains to be offset. If so, the process continues to step S2600 where the counter j is incremented.

The process then returns to step S2200. Thus, steps S2200 through S2500 are repeated for each of the probes T2-T6, and respective arrays AVE_T2 through AVE_T6 are generated at step S2400. These arrays of resistance values constitute the zone characteristic data referenced in step S2000 of FIG. 4.

Referring back to FIG. 4, once the zone characteristic data has been generated, the process continues to step S3000 for generating refined lamp-control parameters. In a preferred embodiment, step S3000 includes the steps shown in the flowchart of FIG. 10. This process can be performed by the parameter-processing device 36 shown in FIG. 8. This process generally includes reducing the baseline and offset data arrays, normalizing the offset data arrays based on the baseline data array, and then using the normalized offset data to calculate (or adjust) lamp-control parameters used by the control system 26 to control the lamps 14 based on information from the temperature probes 24.

Figure 10:
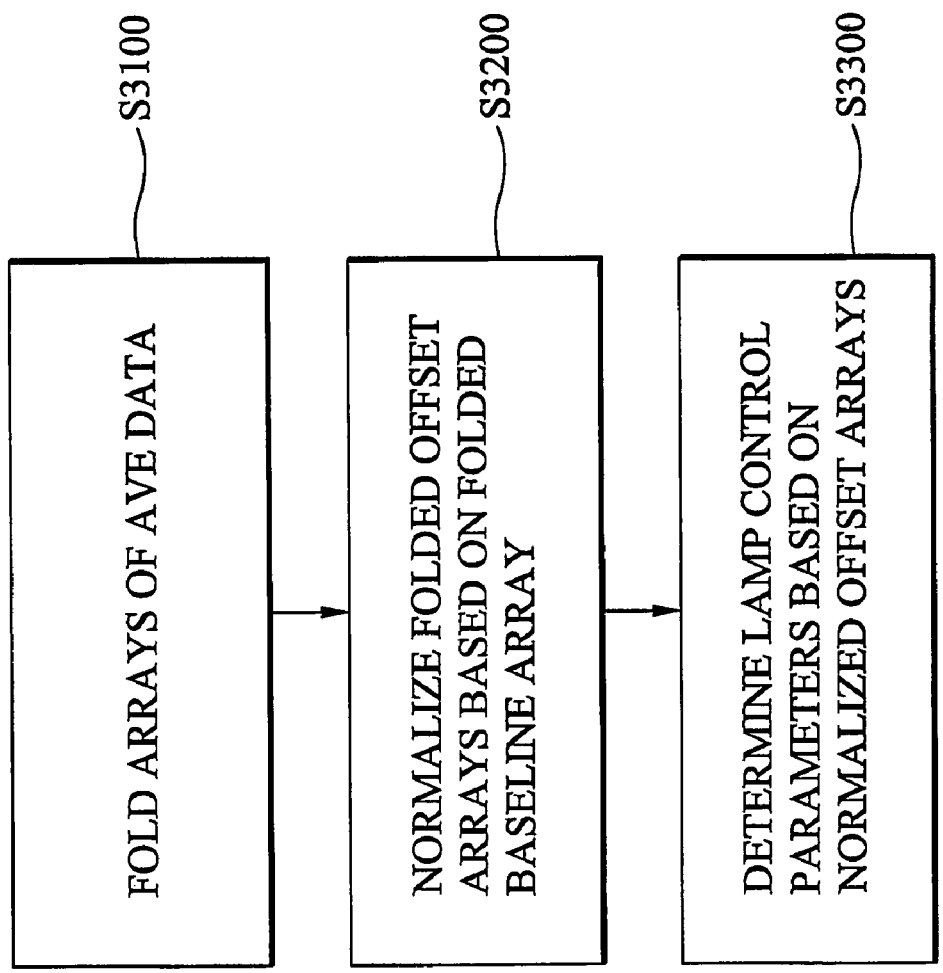
FIG. 10 shows a flowchart of steps in a process of generating lamp-control parameters.
Figure 11A:
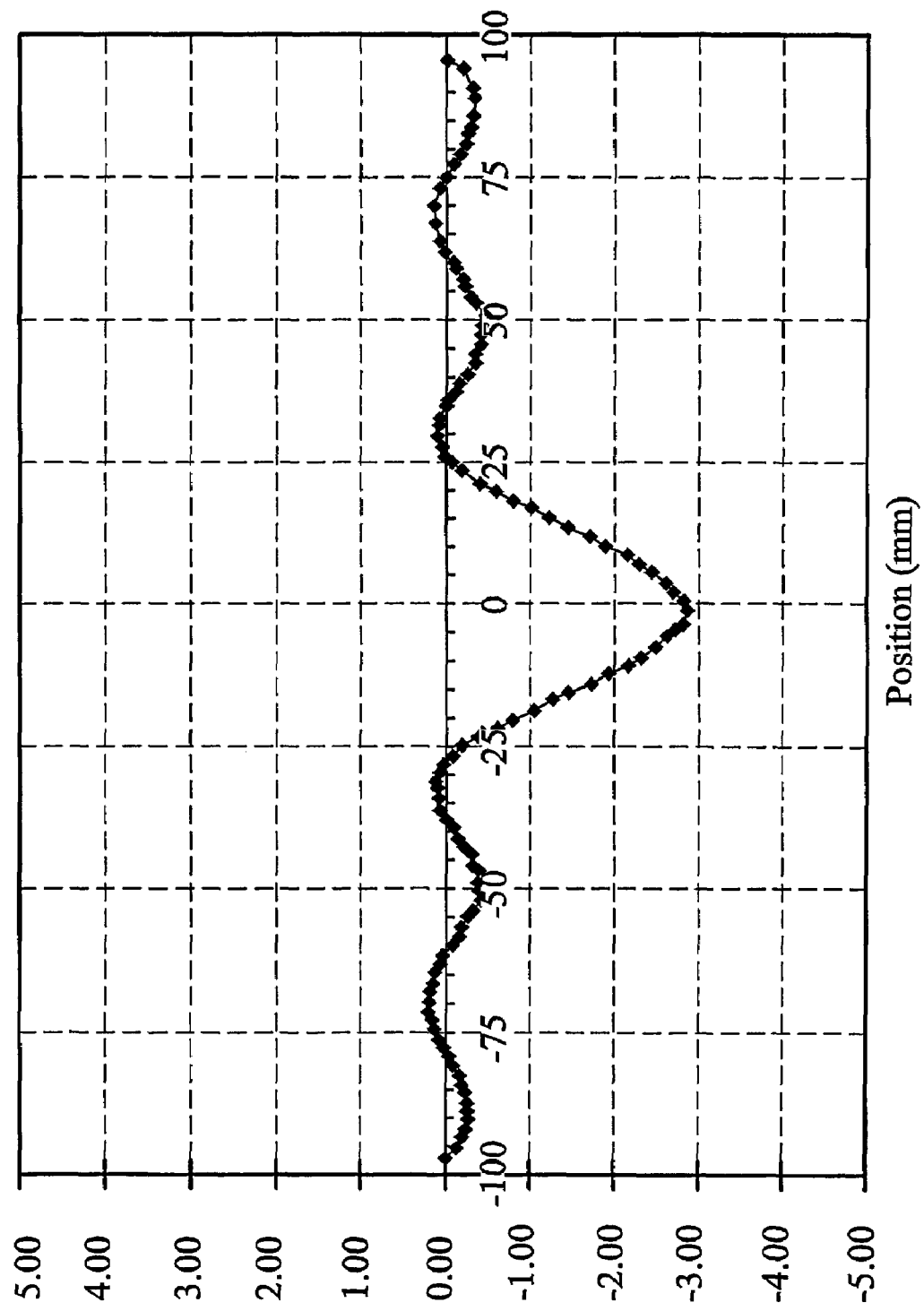
FIGS. 11A-11F show graphs of the normalized offset arrays generated during the process of FIG. 10.
Figure 11B:
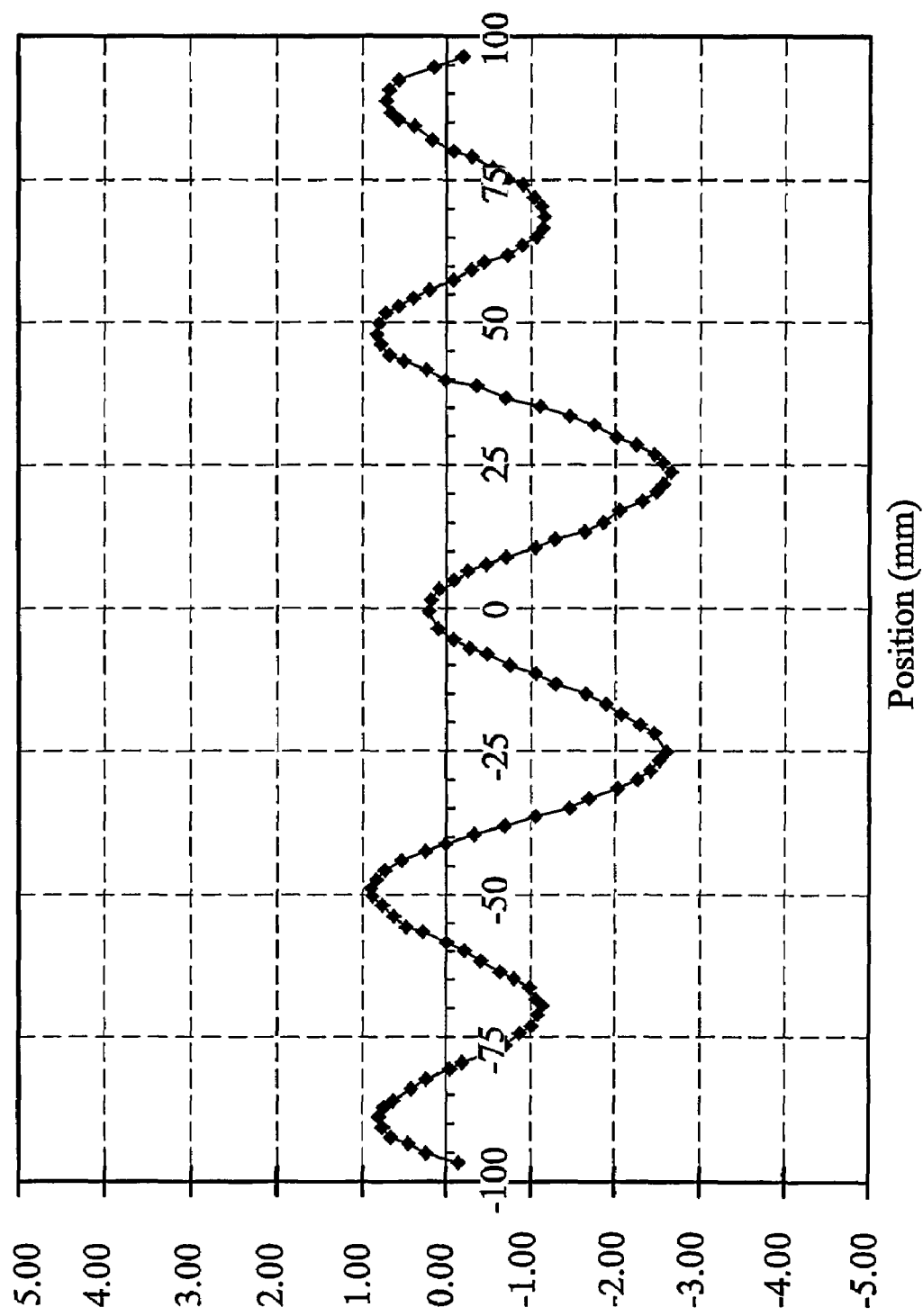
Figure 11C:
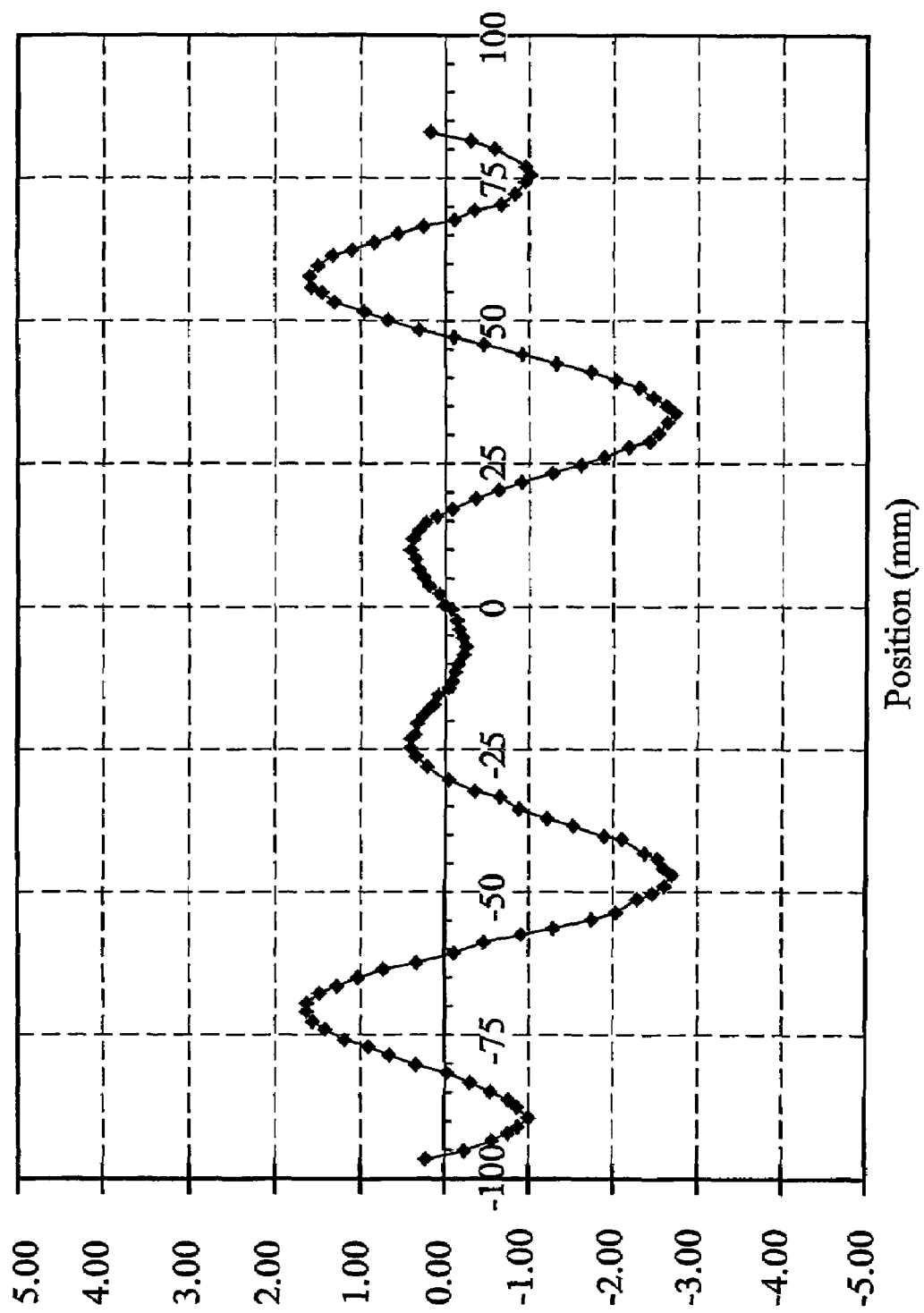
Figure 11D:
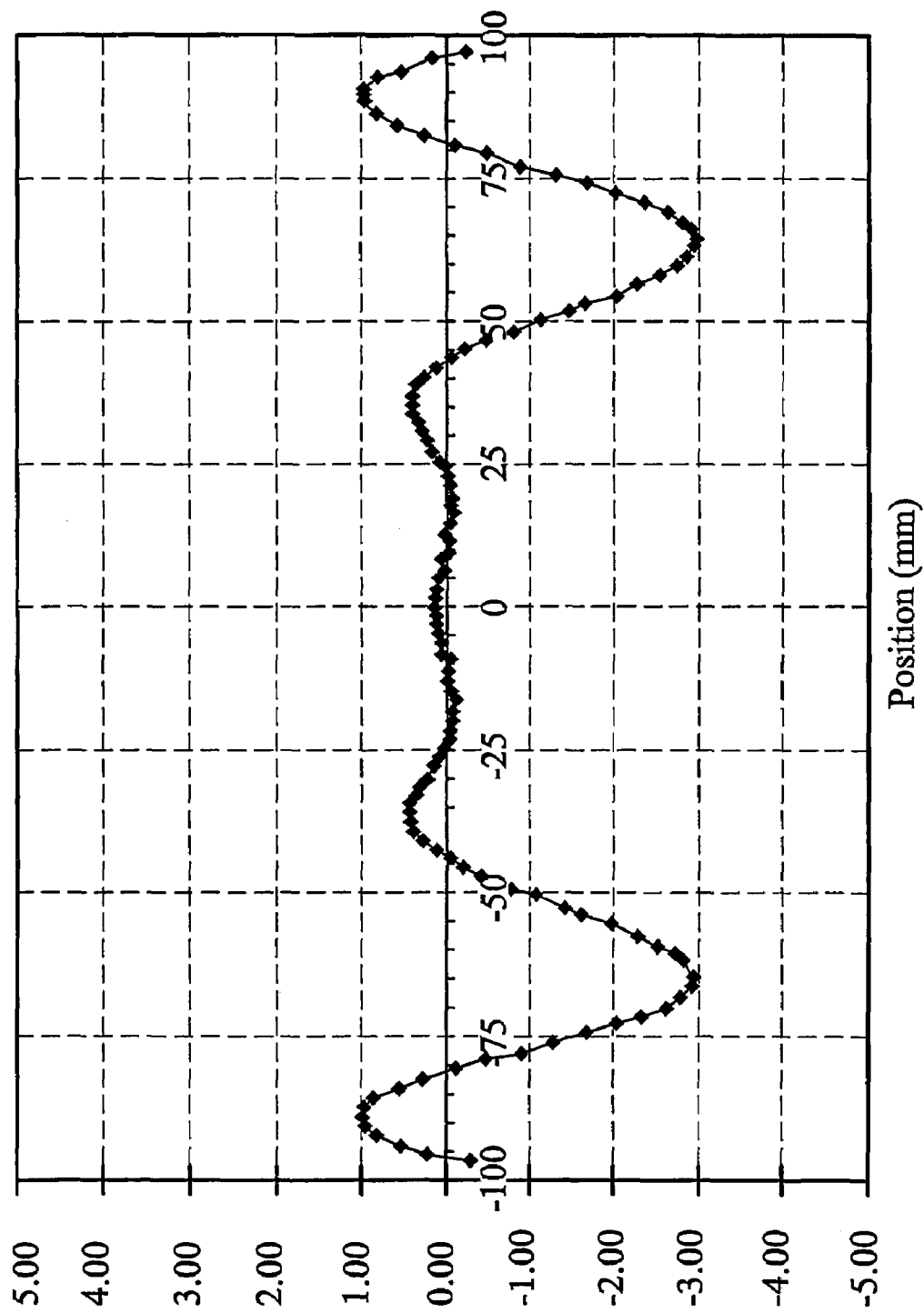
Figure 11E:
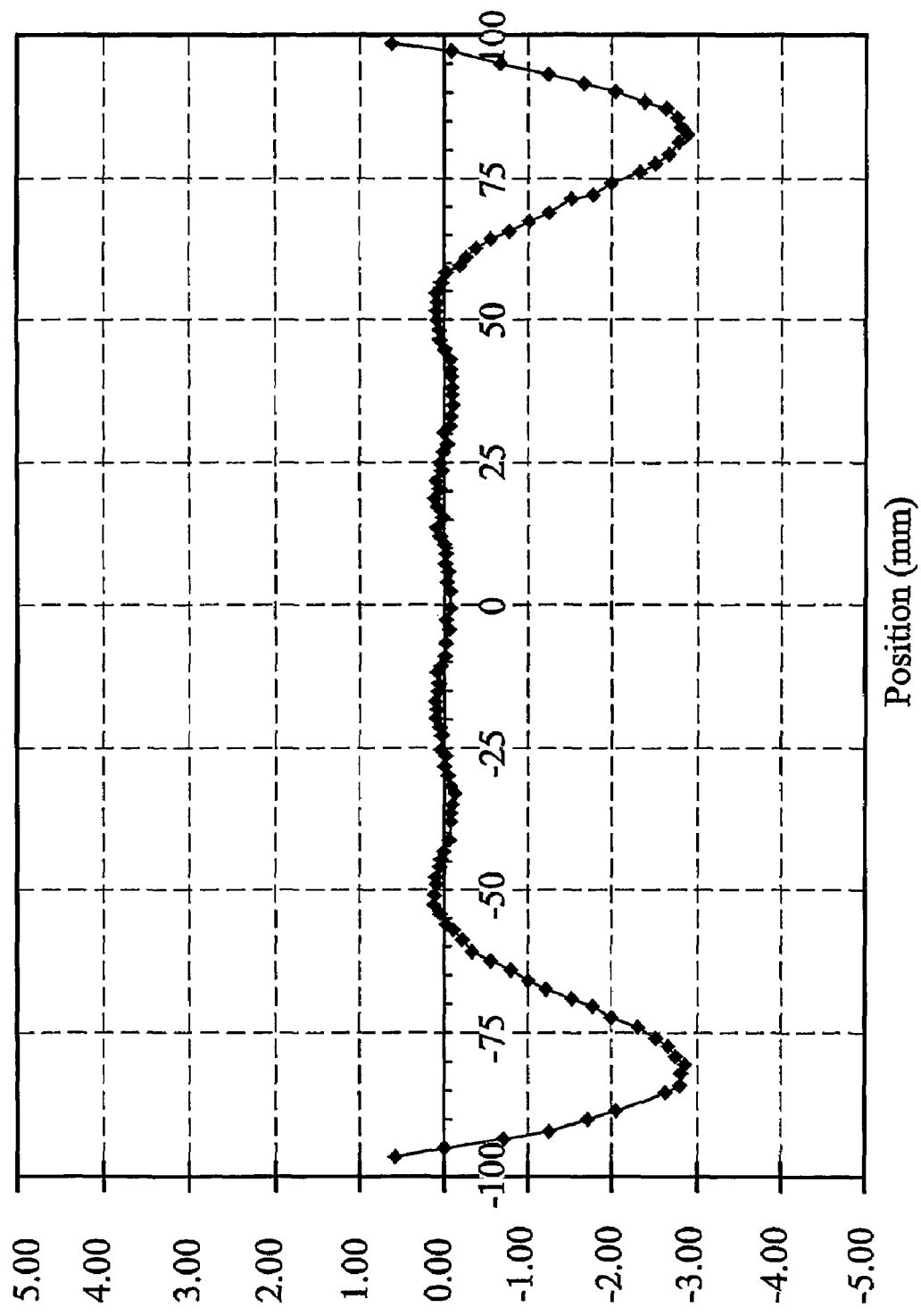
Figure 11F:
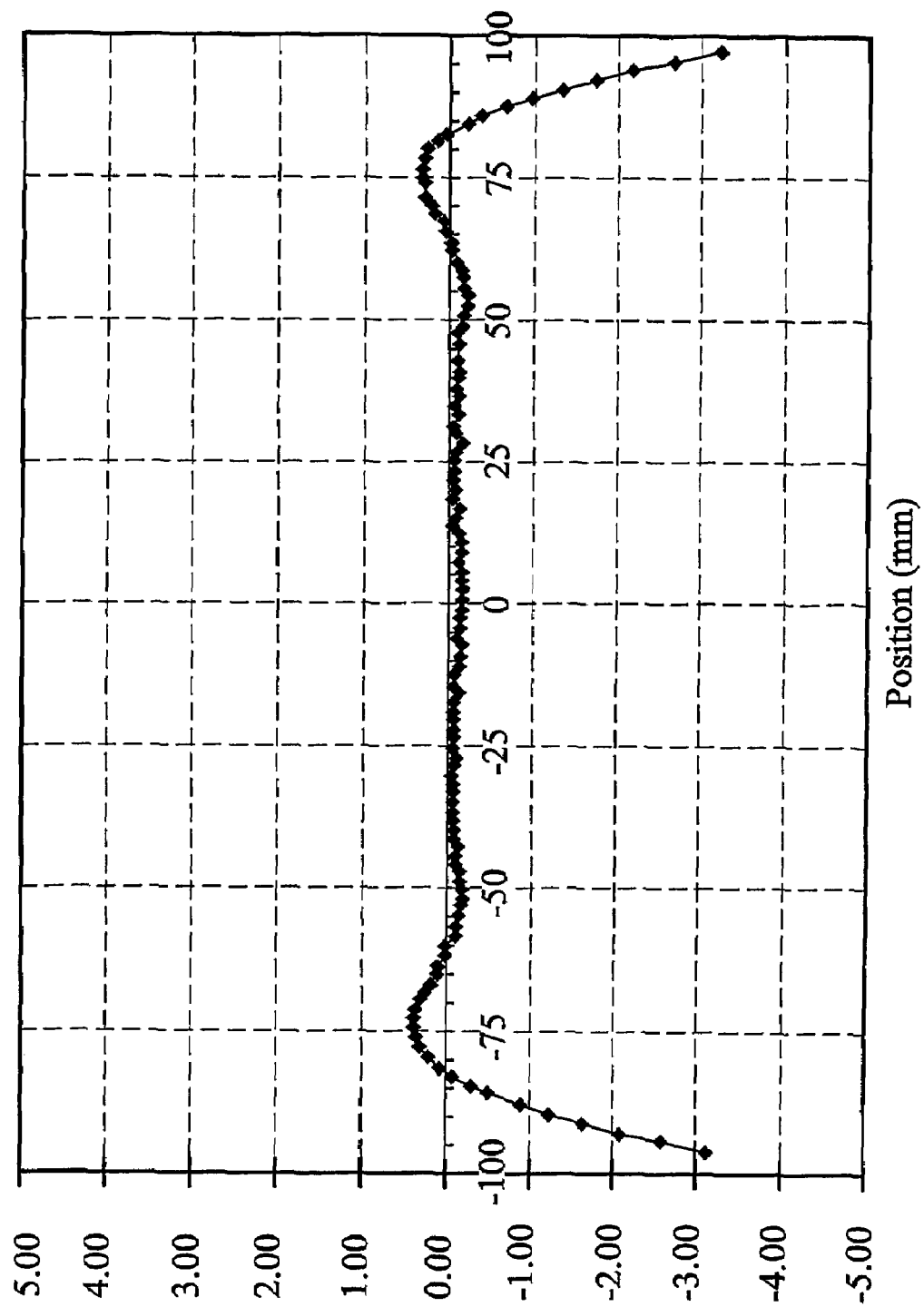

The process shown in FIG. 10 begins at step S3100, which includes data reduction by folding the baseline resistance array AVE_B and each of the offset resistance arrays AVE_T1 through AVE_T6. In a preferred embodiment, a folding function for folding each array of average resistances $RA_1$ thru $RA_n$ can be expressed as:

$$RF_i = (RA_i + RA_{n-i+1})/2$$

where i is an integer ranging from 1 to (n–1)/2, or one less than half the number n of elements in each of the resistance arrays. This function generates an array where the first array element $RF_1$ is an average of the first and last resistance values $RA_1$ and $RA_n$, the second array element $RF_2$ is an average of the second and second to last resistance values $RA_2$ and $RA_{n-1}$, and so on. This way, resistance values corresponding to equal distances from the wafer center (or equal radii) are averaged to produce a single value representative of each measurement position P between the wafer center and the wafer edge. This reduction is desirable given the generally symmetrical nature of the wafer 20 about the center thereof when processed in the RTP system 10. The folding operation is performed on the baseline array AVE_B to generate a baseline folded array FAVE_B, and is performed on the offset arrays AVE_T1 through AVE_T6 to generate respective offset folded arrays FAVE_T1 through FAVE_T6.

Next, at step S3200, the offset folded arrays FAVE_T1 through FAVE_T6 are normalized based on the baseline folded array FAVE_B to generate normalized offset arrays NAVE_T1, NAVE_T2, NAVE_T3, NAVE_T4, NAVE_T6, and NAVE_T7, where:

NAVE_T1 = FAVE_T1 – FAVE_B
...
NAVE_T7 = FAVE_T7 – FAVE_B

FIGS. 11A-11F show exemplary graphs of the normalized offset arrays NAVE_T1 through NAVE_T6, respectively, where the abscissa represents the distance (mm) from the center of the wafer 20, and the ordinate represents normalized resistance values (i.e., the values of respective elements of the normalized offset arrays). These graphs illustrate examples of change characteristics associated with the respective temperature offsets from step S2000. Recall that the first data element of each array corresponds to the outermost measurement point near the edge of the wafer 20, while the last data element of each array corresponds to the centermost measurement point of the wafer 20. Thus, in FIGS. 11A-11F, each data element (except for the data element corresponding to the center) of the arrays has been plotted twice in order to illustrate the effect of the respective offsets across the entire wafer 20 rather than just across half of the wafer 20.

Finally, at step S3300, lamp control parameters (e.g., revised offset values for the temperature probes 24) are determined based on the normalized offset arrays. In the present embodiment, this is accomplished by the parameter-processing device 36 (FIG. 8) as follows. A wafer 20 is run in an RTP system 10 according to a prescribed recipe (e.g., 925° C. for 20 sec). After the wafer 20 is processed in the RTP system 10, an array of raw data RAW (e.g., array of sheet resistances) for the processed wafer 20 is generated (e.g., according to steps S1310 and S1320 described above). The raw data array is then used to determine adjustment amounts (referred to hereinafter as "delta offsets") for the baseline offset values determined at step S1100 (FIG. 5) as follows.

Recall that for each of the temperature probes T1-T6, a respective baseline offset value BO1-BO6 was determined at step S1100 (FIG. 5). Now, a delta offset ΔO1-ΔO6 will be calculated for each of the baseline offset value BO1-BO6. The delta offset values ΔO1-ΔO6 are variables in a series of weighted error WE functions, where a weighted error WE is calculated for each of the corresponding elements of the normalized folded arrays according to the following expression:

$$WE_k = \{[((NAVE\_T1_k)(\Delta O1) + \\ (NAVE\_T2_k)(\Delta O2) + (NAVE\_T3_k)(\Delta O3) + (NAVE\_T4_k)(\Delta O4) + \\ (NAVE\_T6_k)(\Delta O6) + (NAVE\_T7_k)(\Delta O7)) + \Delta RAW_k]^2\}$$

where k ranges from 1 to (n–1)/2, and $\Delta RAW_k$ is the difference between the raw-data sheet-resistance value $RAW_k$ and an average of the raw-data sheet resistances according to the following expression:

$$\Delta RAW_k = RAW_k - AVE(RAW)$$

where AVE(RAW) represents the average of first k resistance values in the RAW array. The delta offsets ΔO1-ΔO6 are determined by selecting values for the delta offsets ΔO1-ΔO6 such that a sum total of the weighted errors WE is minimized to achieve a least total error LTE. The least total error LTE can be expressed as follows:

$$LTE = \min\left(\sum_{k=1}^{(n-1)/2} WE_k\right)$$

The delta offset values ΔO1-ΔO6 can be determined by the parameter-processing device 36 using processing software (e.g., where the parameter-processing device 36 is a computer), such as Excel Solver (developed and distributed by Microsoft Inc.), to determine what values of ΔO1-ΔO6 will achieve a least total error LTE according to the above expressions.

Once the delta offsets ΔO1-ΔO6 have been determined, new revised temperature offset values RO1-RO6 for the temperature probes T1-T6, respectively, can be calculated that will now account for zone coupling and provide for a multi-zone interference correction. The revised temperature offset values RO1-RO6 equal a sum of a respective one of the delta offsets ΔO1-ΔO6 and a respective one of the baseline offset values BO1-BO6 (i.e., RO1=BO1+ΔO1, RO2=BO2+ΔO2, etc.).

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that can issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions can be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of tuning a rapid thermal processing system for use in thermal processing of semiconductor wafers, the method comprising:
    heating a wafer using a plurality of heating zones uniformly disbursed across and equidistant to a first longitudinal surface of the wafer;
    determining baseline offset values using a plurality of respective temperature sensors uniformly disbursed across and equidistant to a second longitudinal surface of the wafer that is on an opposite side of the wafer than the first surface;
    generating zone characteristic data that includes information indicative of heating variations among each of the plurality of heating zones resulting from a predetermined temperature sensor offset value; and
    calculating revised offset values for the plurality of temperature sensors based at least in part on the zone characteristic data, by determining adjustment amounts for each of the baseline offset values based at least in part on a series of weighted error functions.

2. A method according to claim 1, wherein the generating of the zone characteristic data further includes controlling the rapid thermal processing system to process a first wafer including heating a first heating zone of the plurality of heating zones to an offset temperature and heating the remaining of the plurality of heating zones to a prescribed temperature, the offset temperature being different than the prescribed temperature.

3. A method according to claim 2, wherein the generating of the zone characteristic data includes measuring sheet resistance of the processed first wafer at a plurality of positions on a surface of the first wafer, each of the plurality of positions being along at least one of a plurality of lines, each of the plurality of lines extending across a diameter of the surface of the processed first wafer, each of the plurality of lines being angularly displaced from the other of the plurality of lines.

4. A method according to claim 3, wherein the generating of the zone characteristic data further includes calculating a first set of average resistance values, the first set of average resistance values including average resistances of corresponding positions on the plurality of lines across the surface of the processed first wafer.

5. A method according to claim 4, wherein the generating of the zone characteristic data further includes controlling the rapid thermal processing system to process a second wafer including heating a second heating zone of the plurality of heating zones to the offset temperature and heating the remaining of the plurality of heating zones to the prescribed temperature.

6. A method according to claim 5, wherein the generating of the zone characteristic data includes measuring sheet resistance of the processed second wafer at a plurality of positions on a surface of the second wafer, each of the plurality of positions being along at least one of a plurality of lines, each of the plurality of lines extending across a diameter of the surface of the processed second wafer, and each of the plurality of lines being angularly displaced from each other.

7. A method according to claim 6, wherein the generating of the zone characteristic data further includes calculating a second set of average resistance values, the second set of average resistance values including average resistances of corresponding positions on the plurality of lines across the surface of the processed second wafer.

8. A method according to claim 1, wherein the adjustment amounts are determined by selecting said adjustment amounts so that a sum of the weighted error functions is minimized.

9. A method of calibrating a rapid thermal processing system for use in thermal processing of semiconductor wafers, the method comprising:
    sequentially processing a plurality of wafers using a plurality of heating zones uniformly disbursed across and equidistant to a first longitudinal surface of each wafer;
    detecting temperatures during the processing of the plurality of wafers using a plurality of respective temperature sensors uniformly disbursed across and equidistant to a second longitudinal surface of each wafer that is on an opposite side of each wafer than the first surface, wherein a different one of the plurality of temperature sensors is offset by a predetermined amount while processing a corresponding one of the wafers;
    generating zone characteristic data based on the detected temperatures made on the thus processed wafers; and
    calculating offset values for the temperature sensors based at least in part on the zone characteristic data, by determining adjustment amounts for each of the baseline offset values based at least in part on a series of weighted error functions.

10. A method according to claim 9, wherein the generating of the zone characteristic data includes measuring sheet resistances of the processed wafers.

11. A method according to claim 10, wherein, for each of the plurality of processed wafers, sheet resistance is measured at a plurality of positions that are dispersed along a plurality of lines extending across the wafer and angularly displaced from each other.

12. A method according to claim 11, wherein the generating of the zone characteristic data further includes calculating a respective set of average resistance values for each of the plurality of processed wafers.

13. A method according to claim 9, wherein the processing of the plurality of wafers includes, for each wafer, offsetting a respective one of the temperature sensors by the predetermined amount and the remainder of the temperature sensors by respective baseline offset values.

14. A method according to claim 9, wherein the adjustment amounts are determined by selecting said adjustment amounts so that a sum of the weighted error functions is minimized.

15. A method of tuning a rapid thermal processing system for use in thermal processing of semiconductor wafers, the method comprising:

heating a wafer using a plurality of heating zones uniformly disbursed across and equidistant to a first longitudinal surface of the wafer;

determining baseline offset values using a plurality of respective temperature sensors uniformly disbursed across and equidistant to a second longitudinal surface of the wafer that is on an opposite side of the wafer than the first surface;

heating a first heating zone of the plurality of heating zones to an offset temperature and heating the remaining of the plurality of heating zones to a prescribed temperature, the offset temperature being different than the prescribed temperature, generating zone characteristic data that includes measuring sheet resistance variations of the wafer at a plurality of positions on a surface of the wafer corresponding to each of the plurality of heating zones that result from a predetermined temperature sensor offset value; and calculating revised offset values for the plurality of temperature sensors based at least in part on the zone characteristic data, by determining adjustment amounts for each of the baseline offset values based at least in part on a series of weighted error functions and wherein the adjustment amounts are determined by selecting said adjustment amounts so that a sum of the weighted error functions is minimized.

16. A method according to claim 15, wherein each of the plurality of positions are along at least one of a plurality of lines, each of the plurality of lines extending across a diameter of the surface of the processed wafer and each of the plurality of lines being angularly displaced from the other of the plurality of lines.

17. A method according to claim 16, wherein generating the zone characteristic data further includes calculating a first set of average sheet resistance values, the first set including average sheet resistances of corresponding positions on the plurality of lines across the surface of the processed wafer.

18. A method according to claim 17, wherein the generating of the zone characteristic data further includes controlling the rapid thermal processing system to process a second wafer including heating a second heating zone of the plurality of heating zones to the offset temperature and heating the remaining of the plurality of heating zones to the prescribed temperature.

19. A method according to claim 18, wherein the generating of the zone characteristic data further includes measuring sheet resistance of the processed second wafer at a plurality of positions on a surface of the second wafer, each of the plurality of positions being along at least one of a plurality of lines, each of the plurality of lines extending across a diameter of the surface of the processed second wafer, and each of the plurality of lines being angularly displaced from each other.

20. A method according to claim 19, wherein the generating of the zone characteristic data further includes calculating a second set of average sheet resistance values, the second set of average sheet resistance values including average sheet resistances of corresponding positions on the plurality of lines across the surface of the processed second wafer.

* * * * *